(12) United States Patent
Cochet et al.

(10) Patent No.: US 10,948,611 B2
(45) Date of Patent: Mar. 16, 2021

(54) DEVICE FOR MEASURING DOSES OF IONIZING PARTICLES

(71) Applicants: STMicroelectronics (Crolles 2) SAS, Crolles (FR); Centre National De La Recherche Scientifique, Paris (FR); UNIVERSITE D'AIX MARSEILLE, Marseilles (FR); UNIVERSITE DE TOULON, La Garde (FR)

(72) Inventors: Martin Cochet, Paris (FR); Dimitri Soussan, Grenoble (FR); Fady Abouzeid, Grenoble (FR); Gilles Gasiot, Seyssinet-Pariset (FR); Philippe Roche, Biviers (FR)

(73) Assignees: STMicroelectronics (Crolles 2) SAS, Crolles (FR); Centre National De La Recherche Scientifique, Paris (FR)

( * ) Notice: Subject to any disclaimer, the term of this patent is extended or adjusted under 35 U.S.C. 154(b) by 395 days.

(21) Appl. No.: 15/981,321

(22) Filed: May 16, 2018

(65) Prior Publication Data
US 2018/0335526 A1    Nov. 22, 2018

(30) Foreign Application Priority Data
May 17, 2017    (FR) ...................... 1754359

(51) Int. Cl.
*G01T 1/02*      (2006.01)
*H03K 3/03*      (2006.01)

(52) U.S. Cl.
CPC ........... *G01T 1/026* (2013.01); *H03K 3/0315* (2013.01)

(58) Field of Classification Search
CPC .............................. G01T 1/026; H03K 3/0315
See application file for complete search history.

(56) References Cited

U.S. PATENT DOCUMENTS

2006/0186342 A1* 8/2006 Burger ...................... G01T 1/17
250/370.01

FOREIGN PATENT DOCUMENTS

| CN | 106443420 A | 2/2017 |
|---|---|---|
| WO | 2006078720 A2 | 7/2006 |

OTHER PUBLICATIONS

INPI Search Report and Written Opinion for FR 1754359 dated Mar. 19, 2018 (7 pages).
Agustin, Javier et al: "Design and Characterization of a Built-In CMOS to Smart Sensor," IEEE Transactions on Nuclear Science, vol. 62, No. 2, Apr. 2015, pp. 443-450.
(Continued)

*Primary Examiner* — David P Porta
*Assistant Examiner* — Meenakshi S Sahu
(74) *Attorney, Agent, or Firm* — Crowe & Dunlevy

(57) ABSTRACT

Absorbed ionizing particles differentially effect first and second acquiring circuit stages configured to respectively generate first and second acquisition signals. Each acquisition signal has a characteristic that is variable as a function of an amount of absorbed ionizing particles. A measuring circuit generates, on the basis of the first and second acquisition signals, a relative parameter indicative of a relationship between the variable characteristics. A computation of a total ionizing dose is made using a 1st- or 2nd-degree polynomial relationship in the relative parameter.

25 Claims, 2 Drawing Sheets

(56) References Cited

OTHER PUBLICATIONS

Carbonetto, S. et al: "Ring Oscillators Response to Irradiation and Application to Dosimetry," Proceedings of the Argentine School of Micro-Nanoelectronics, Technology and Application 2009, IEEE Catalog No. CFP0954E, pp. 1-4.
Jagannathan, S. et al: "Sensitivity of High-Frequency RF Circuits to Total Ionizing Dose Degradation," IEEE Transactions on Nuclear Science, vol. 60, No. 6, Dec. 2013, pp. 4498-4504.
Jain, C P: "Circuit Techniques Using Substrate Bias for Design of Radiation Hardened Voltage Controlled Oscillator," International Journal of Computing and Digital Systems, ISSN (2210-142X), Int. J. Corn. Dig. Sys. 6, No. 3 (May 2017) (6 pages).

* cited by examiner

DEVICE FOR MEASURING DOSES OF IONIZING PARTICLES

PRIORITY CLAIM

This application claims the priority benefit of French Application for Patent No. 1754359, filed on May 17, 2017, the disclosure of which is hereby incorporated by reference in its entirety to the maximum extent allowable by law.

TECHNICAL FIELD

Embodiments relate to electronic circuits, and more precisely to electronic circuits liable to be irradiated by ionizing particles and in particular to electronic devices capable of quantitatively measuring ionizing particles in the form of what is called a total ionizing dose (TID).

BACKGROUND

Generally, when an electronic circuit is exposed to ionizing particle radiation, such as alpha/beta particles, X/gamma rays, protons or neutrons, the accumulation of the electrical charge deposited by these ionizing particles may significantly modify intrinsic technical properties of the irradiated electronic circuit, such as, for example, the threshold voltages of MOS transistors or operating frequencies.

In a circuit with a fully-depleted silicon-on-insulator (FDSOI) substrate, for example, such an accumulation of electrical charge in particular leads to an increase in speed and leakage currents in nMOS transistors, and to a decrease in speed and leakage currents in pMOS transistors.

Total ionizing dose (TID) is therefore commonly used to quantify the amount of energy absorbed by such an electronic circuit in joules/kg so as to allow the impacts on the performance of the circuit to be evaluated and, optionally, compensation of the effects of these impacts to be correctly implemented.

However, conventional devices for measuring ionizing particles generally have drawbacks such as a limited choice of types of ionizing particles to be detected, a requirement for at least one additional measuring module incompatible with present-day CMOS technology, or an imprecise quantitative measurement.

Thus, there is a need to provide a technical solution that is completely compatible with commonplace CMOS technologies, that is of low complexity, that takes up little silicon real estate and that allows doses of ionizing particles to be measured with a low sensitivity to variations in temperature and in applied voltages and with an improved accuracy but without requiring a dedicated clock signal or an additional particular measuring module.

SUMMARY

According to one aspect, a device for measuring ionizing particles is provided. The device comprises: an acquiring circuit including first and second acquiring circuit stages respectively possessing different sensitivities to ionizing particles absorbed by the acquiring circuit and configured to respectively generate first and second acquisition signals each having a characteristic that is variable as a function of the amount of ionizing particles absorbed; and a processing circuit including a measuring circuit that is configured to generate, on the basis of the first and second acquisition signals, a relative parameter Nr between said variable characteristics, and a computing circuit configured to compute a total ionizing dose using a 1st- or 2nd-degree polynomial relationship in Nr.

The polynomial relationship may, for example, further include an initial parameter N0 corresponding to an absence of ionizing particles absorbed by the acquiring circuit.

This initial parameter N0 and the coefficients of the polynomial relationship may, for example, be set during a calibrating phase.

Advantageously, such a device thus allows the amount of ionizing particles absorbed by the device to be accurately and simply measured by way of a measurement of the relative parameter Nr and the total ionizing dose to be simply and accurately deduced therefrom by simply applying a 1st or 2nd-degree, generally 2nd-degree, polynomial relationship in Nr.

The implementation of said device is furthermore completely compatible with commonplace CMOS technologies.

By way of non-limiting indication, the characteristic of each acquisition signal, which is variable as a function of the amount of ionizing particles absorbed, is the frequency of the corresponding acquisition signal.

Furthermore, according to one embodiment, the relative parameter Nr is a ratio of frequencies of two signals obtained from the acquisition signals. More precisely, one of these two signals may result from a frequency division of one of the acquisition signals and the other signal may be the other acquisition signal.

According to one embodiment, the first acquiring circuit stage comprises an nMOS first ring oscillator and the second acquiring circuit stage comprises a pMOS second ring oscillator.

According to this embodiment, the polynomial relationship is $A*(N0-Nr)+B*(N0-Nr)^2$, where A and B are coefficients one of which may possibly be zero.

According to another embodiment, the first acquiring circuit stage comprises a pMOS first ring oscillator and the second acquiring circuit stage comprises an nMOS second ring oscillator.

According to this other embodiment, the polynomial relationship is $A*(Nr-N0)+B*(Nr-N0)^2$, where A and B are coefficients one of which may possibly be zero.

By way of non-limiting example, the measuring circuit may for example comprise: a frequency-divider circuit stage configured to receive the first acquisition signal and configured to deliver a third acquisition signal having a frequency that is equal to the frequency of the first acquisition signal divided by E, E being a preset integer; and a state-machine circuit stage that is coupled to the frequency-divider circuit stage and configured to receive the second and third acquisition signals, the state-machine circuit stage being configured to generate the relative parameter Nr equal to the ratio between the frequencies of the second and third acquisition signals.

According to yet another embodiment, the acquiring circuit comprises low-threshold-voltage (LVT) MOS transistors and the processing circuit comprises regular-threshold-voltage (RVT) MOS transistors.

The structures of these LVT and RVT transistors are well known to those skilled in the art. Typically, the threshold voltage of an LVT transistor is, for example, lower than 350 mV and the threshold voltage of an RVT transistor is comprised between 350 mV and 500 mV.

Such a use of low-threshold-voltage transistors makes it possible to make the acquiring circuit more sensitive to the impacts of ionizing particles.

By way of non-limiting indication, the device may for example be produced in digital technology.

Such a use of a digital circuit in particular in the computing circuit advantageously allows a more accurate implementation of the polynomial relationship.

According to another aspect, an electronic system comprising at least one device such as defined above is provided.

According to yet another aspect, an electronic apparatus comprising an electronic system such as defined above is provided.

BRIEF DESCRIPTION OF THE DRAWINGS

Other advantages and features of the invention will become apparent on examining the detailed description of completely non-limiting embodiments and the appended drawings, in which.

DETAILED DESCRIPTION OF THE DRAWINGS

Figure 1:
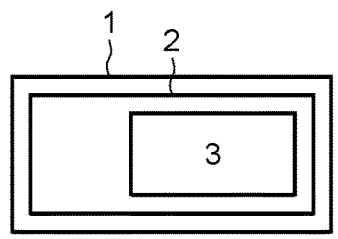
FIG. 1 is a block diagram of an electronic apparatus.

In FIG. 1, the reference 1 designates an electronic apparatus, such as a satellite communication apparatus, that is liable to be located in a space irradiated by ionizing particles such as alpha/beta particles, X/gamma radiation, protons or neutrons.

The electronic apparatus 1, for example, comprises an electronic system 2 configured to process data received and emitted by the electronic apparatus 1. The electronic system 2 may, for example, include one or more integrated circuits and/or one or more microprocessors.

Ionizing particles received by the apparatus 1 influence, to a greater or lesser extent, the performance of the electronic system 2 because nMOS/pMOS transistors of the electronic system 2 operate faster or slower as a result. Therefore, the frequency of the electronic system 2 is also influenced by the received ionizing particles.

In order to detect this type of variation in performance, the electronic system 2 comprises a measuring circuit device 3 that is configured to quantitatively measure a total ionizing dose TID received by the electronic apparatus 1.

Figure 2:
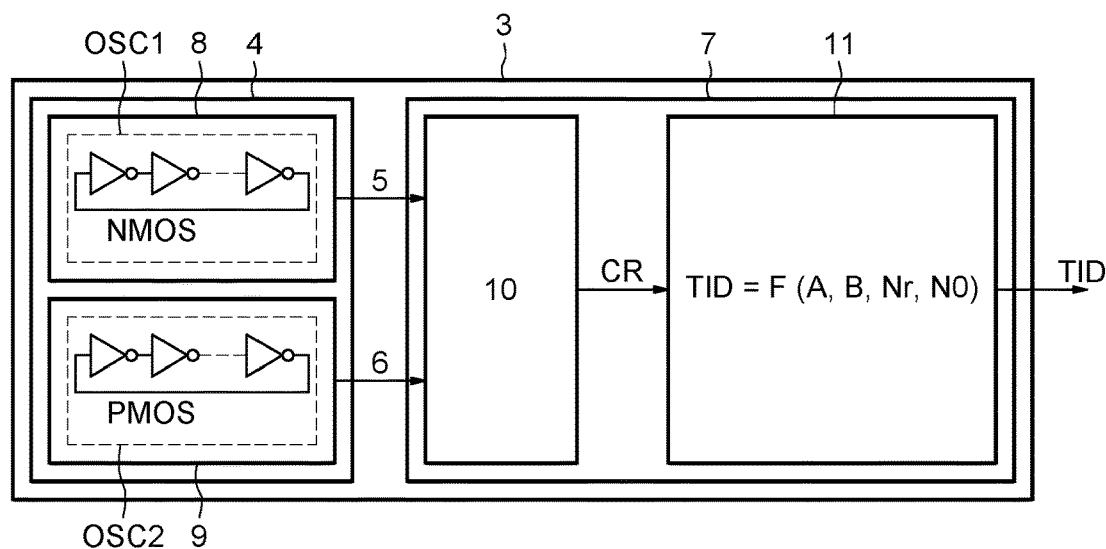
FIGS. 2 and 3 schematically illustrate examples of a measuring device.

The reader is now referred to FIG. 2, which schematically illustrates an example of the measuring circuit device 3 according to one embodiment.

The device 3 comprises an acquiring circuit 4 that is configured to generate first and second acquisition signals 5 and 6, and a processing circuit 7 that is configured to determine, on the basis of the first and second acquisition signals 5 and 6, said total ionizing dose TID of the apparatus 1.

The acquiring circuit 4 comprises a first acquiring circuit stage 8 and a second acquiring circuit stage 9, which are, for example, configured to respectively perform the same function, here for example the generation of a periodic signal having a given frequency.

To do this, the first acquiring circuit stage 8 here comprises a first ring oscillator OSC1 that is configured to generate the first acquisition signal 5, and the second acquiring circuit stage 9 here comprises a second ring oscillator OSC2 that is configured to generate the second acquisition signal 6.

In order to differentiate the first and second acquisition signals 5 and 6, the first and second acquiring circuit stages 8 and 9 are configured to respectively have different sensitivities to the ionizing particles, for example opposite sensitivities.

In this respect and by way of example, the first ring oscillator OSC1 is produced only with nMOS transistors whereas the second ring oscillator OSC2 is produced only with pMOS transistors.

It should be noted that the speed of nMOS transistors is generally increased after irradiation whereas the speed of pMOS transistors is generally decreased. In other words, the frequency of the first acquisition signal 5 is increased whereas the frequency of the second acquisition signal 6 is decreased once the acquiring circuit 4 has been irradiated.

Although it is possible to use various existing process monitoring circuits to implement the first and second acquiring circuit stages 8 and 9, it is preferable to produce the acquiring circuit 4 with low-threshold-voltage transistors, here for example low-threshold-voltage (LVT) transistors in a 28 nm FDSOI CMOS technology, so as to decrease the sensitivity of the nMOS and pMOS transistors to variations in temperature and applied voltage.

Thus, for transistors having different channel lengths in 28 nm FDSOI CMOS technology, said sensitivity to variations in temperature and applied voltage decreases with the increase in channel length. It should be noted that leakage current is also considerably decreased with this increase in channel length. The option referred to as PB16 (poly bias 16), i.e. a length equal to the minimum length of the 28 nm FDSOI CMOS technology increased by 16 nm (i.e. 42 nm), ensures a minimum sensitivity to variations in temperature and applied voltage.

As a variant, the first ring oscillator OSC1 may be produced only with pMOS transistors whereas the second ring oscillator OSC2 may be produced only with nMOS transistors. This variant in particular leads to a change of variable in a 1st- or 2nd-degree polynomial relationship used in the processing circuit 7, which relationship will be described in detail below.

The processing circuit 7 comprises a measuring circuit 10 that is coupled to the acquiring circuit 4 and configured to receive the first and second acquisition signals 5 and 6. The measuring circuit 10 is also configured to generate, on the basis of the first and second acquisition signals 5 and 6, a relative parameter Nr between the frequencies of the two signals, which is more precisely here a ratio of the frequencies of two signals obtained from the acquisition signals (5 and 6).

The processing circuit also includes a computing circuit 11 that is configured to receive said relative parameter Nr and that is configured to compute the total ionizing dose TID using said relative parameter Nr and the aforementioned polynomial relationship.

Figure 3:
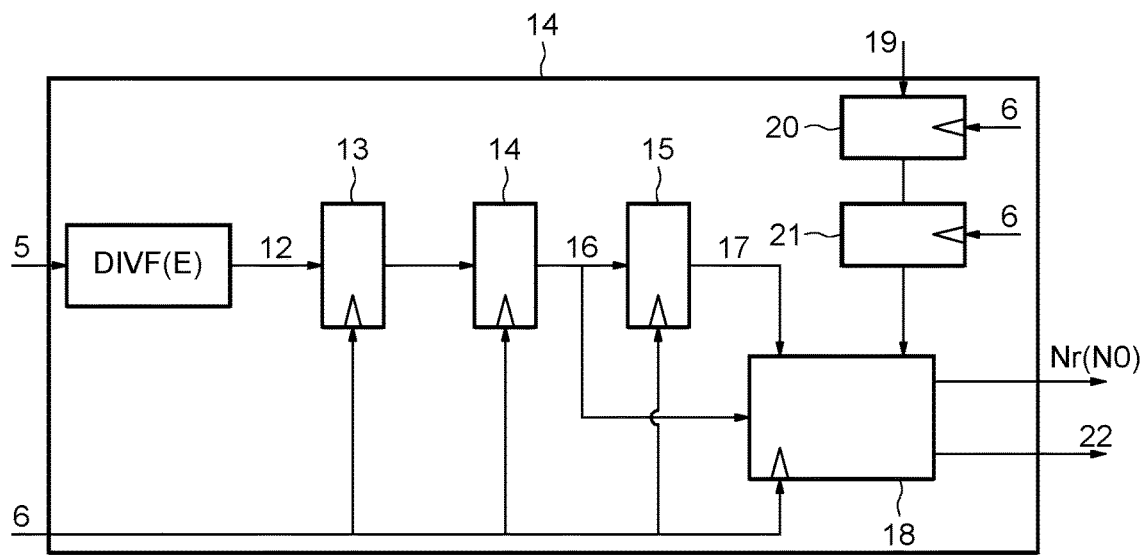

FIG. 3 schematically illustrates an example of the measuring circuit 10 according to one embodiment.

The measuring circuit 10 comprises a frequency-divider stage DIVF configured to receive the first acquisition signal 5 and configured to generate an intermediate acquisition signal 12 having a divided frequency that is equal to that of the first acquisition signal 5 divided by a preset integer E—here for example E=4096.

The intermediate acquisition signal 12 is then delayed by way of a plurality of flip-flops, here for example three D flip-flops, 13 to 15, clocked by the second acquisition signal 6 in order to respectively generate at the outputs of the flip-flops 14 and 15 a third acquisition signal 16 and a delayed third acquisition signal 17 both having said divided frequency.

It should be noted that the three flip-flops 13 to 15 are configured to slightly delay the intermediate acquisition signal 12 so as to allow the rising edges of the third acquisition signal 16 to be clearly distinguished, as will be seen below.

The measuring circuit 10 furthermore comprises a state-machine circuit stage 18 configured to receive the third acquisition signal 16, the delayed third acquisition signal 17, and a reset signal 19 that is synchronized with the second acquisition signal 6 via two additional D flip-flops 20 and 21 that are clocked by the second acquisition signal 6.

The state-machine circuit stage 18 is configured to generate as output said relative parameter Nr and an indication signal 22.

Figure 4:
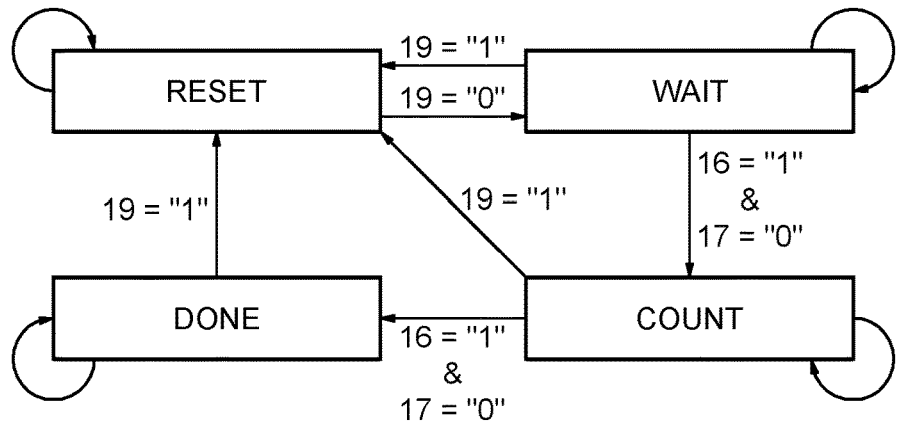
FIG. 4 illustrates an example of an operation of a state-machine circuit stage.

The reader is now referred to FIG. 4, which illustrates in greater detail an example of the operation of the state-machine circuit stage 18.

The state-machine circuit stage 18 has four states: "reset", "wait", "done" and "count".

When the reset signal 19 is in its high state ("1"), the state-machine circuit stage 18 is placed in the "reset" state independently of the second and third signals 6 and 16.

When the reset signal 19 is in its low state ("0"), the stage 18 is switched to the "wait" state until the next rising edge of the third acquisition signal 16. As there is a delay, due to the flip-flop 15, between the third acquisition signal 16 and the delayed third acquisition signal 17, the rising edge of the third acquisition signal 16 is detected if the third acquisition signal 16 is in its low state ("0") and the delayed third acquisition signal 17 is in its high state ("1").

Next, the state-machine circuit stage 18 is switched to its "count" state until the next rising edge of the third signal 16, i.e. when the third acquisition signal 16 is once again in its low state and the delayed third acquisition signal 17 is once again in its high state.

The indication signal 22 is then switched to the high state at the end of the "count" state in order to indicate that the relative parameter Nr is ready to be used by the computing circuit 11.

In the "count" state, the relative parameter Nr is incremented when the second acquisition signal 6 is in its high state. As the frequency of the second signal 6 is higher than that of the third signal 16, the relative parameter Nr is the ratio between the frequencies of the second and third acquisition signals 6 and 16.

As the speed of nMOS transistors will generally increase after irradiation and that of pMOS transistors will decrease, the frequencies of the second and third acquisition signals 6 and 16 will change in opposite directions so as to make the relative parameter Nr vary.

Therefore, the relative parameter Nr is representative of the amount of ionizing particles absorbed by the device 3.

The inventors have moreover observed that, depending on the composition of the ring oscillators, it is possible to determine the dose TID using a polynomial relationship of the type $TID=A*(N0-Nr)+B*(N0-Nr)^2$ or $TID=A*(Nr-N0)+B*(Nr-N0)^2$.

In these relationships, A and B are coefficients, one of which may possibly be zero, and N0 is the value of the parameter Nr in the absence of ionizing particles.

This polynomial relationship is implemented in the computing circuit 11, for example in software form or using specific hardware or firmware circuits.

The 1st- or 2nd-degree polynomial relationship includes a quadratic portion and a linear portion.

When the first acquiring circuit stage 8 is produced with nMOS transistors, the polynomial relationship is written as follows:

$$TID=A*(N0-Nr)+B*(N0-Nr)^2.$$

When the first acquiring circuit stage 8 is produced with pMOS transistors, the polynomial relationship is written as follows:

$$TID=A*(Nr-N0)+B*(Nr-N0)^2.$$

In order to accurately calculate the total ionizing dose TID for circuits fabricated in various technologies and/or for various families of circuits, it is necessary to determine the initial parameter N0 and the coefficients A and B.

This may be done in the factory or with a prototype circuit in a calibrating phase. The obtained values of N0, A and B will then be valid for any circuit analogous to the prototype circuit.

As regards N0, a measurement of N0 is taken when the device 3 is not being irradiated.

In order to determine the coefficients A and B, it is possible, for a series of known reference TID doses, to measure the corresponding values of Nr.

On the basis of all these measurement points, it is then possible, for example, to use a polynomial regression method to optimally approximate the cloud of measurement points with a 1st or 2nd-degree polynomial relationship and thus obtain the coefficients A and B.

Depending on the obtained measurements, the polynomial relationship may optionally be a pure quadratic relationship (A=0) or a pure linear relationship (B=0).

However, generally, the coefficients A and B are both nonzero.

The processing circuit 7 or even the device 3 is implemented entirely in digital (and not analog) technology in order to advantageously allow greater design flexibility and greater accuracy in the measurement of the ionizing particles TID.

Once the coefficients N0, A and B of the polynomial relationship have been determined, the computing circuit 11 is configured to simply and accurately compute the total ionizing dose TID using the relative parameter Nr and the polynomial relationship.

It should be noted that the device 3 also advantageously uses a conventional, triple modular redundancy (TMR) flip-flop so as to make the measuring device 3 more resistant to radiation. The on-silicon implementation of the processing circuit 7 is not very bulky and requires only a silicon area of about 400 $\mu m^2$ in 28 nm FDSOI CMOS technology.

Figure 5:
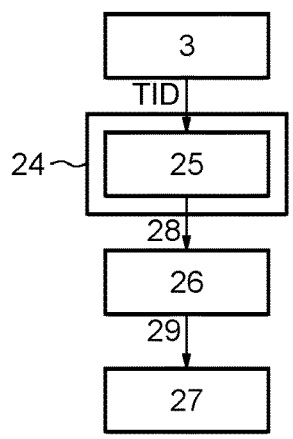
FIGS. 5 and 6 illustrate examples of electronic circuits comprising the measuring device.

FIG. 5 illustrates another example of an electronic circuit 2 comprising the measuring device 3 such as described above.

The electronic circuit 2 comprises a processing circuit 24 including a lookup table 25 that is coupled between the measuring device 3 and a substrate-bias- or supply-voltage (Vdd) generator 26 and other functional circuits 27.

The processing circuit 24 is configured to receive the total ionizing dose TID computed by the device 3 and configured to generate, on the basis of the lookup table 25 and the total ionizing dose TID, a parameter 28 for adjusting the substrate-bias or supply voltage and to deliver this parameter 28 to the substrate-bias- or supply-voltage (Vdd) generator 26.

The generator 26 is also configured to generate, on the basis of the parameter 28, an adjusted substrate-bias- or supply-voltage (Vdd) value 29 and to deliver this adjusted value 29 to the functional circuits 27 in order to compensate for the effects of the impacts of ionizing particles on these circuits 27.

Figure 6:
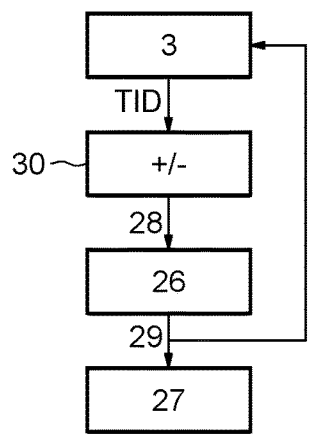

As a variant, the reader is now referred to FIG. 6, which illustrates yet another example of an electronic circuit 2 including the measuring device 3 such as described above.

This electronic circuit 2 comprises, instead of the processing circuit 24 illustrated in FIG. 5, a comparing circuit 30 coupled between the measuring device 3 and the generator 26.

This comparing circuit 30 is configured to compare the relative parameter Nr with the initial parameter N0 so as to generate, on the basis of the result of this comparison, the adjusting parameter 28 and to deliver this parameter 28 to the generator 26.

The generator 26 is configured to receive the parameter 28 delivered by the comparing means 30 and configured to deliver the adjusted value 29 not only to the other functional circuits 27 but also to the measuring device 3.

This fed-back adjusted value 27 advantageously allows the substrate-bias or supply voltage of the measuring device 3 to be adjusted so as to compensate for the effects of the impacts of absorbed ionizing particles.

When the relative parameter Nr is once again substantially equal to the initial parameter N0, this means that the adjustment of the substrate-bias or supply voltage has correctly compensated for the impacts of absorbed ionizing particles.

The invention claimed is:

1. A device for measuring ionizing particles, comprising:
    an acquiring circuit including first and second acquiring circuit stages respectively having different sensitivities to absorbed ionizing particles and configured to respectively generate first and second acquisition signals that each have a characteristic that is variable as a function of an amount of absorbed ionizing particles; and
    a processing circuit including a measuring circuit that is configured to generate, on the basis of the first and second acquisition signals, a relative parameter indicative of a relationship between said characteristics that are variable, and a computing circuit configured to compute a total ionizing dose using a 1st- or 2nd-degree polynomial relationship in said relative parameter.

2. The device according to claim 1, wherein the 1st- or 2nd-degree polynomial relationship includes an initial parameter corresponding to an absence of absorbed ionizing particles.

3. The device according to claim 1, wherein the characteristic that is variable as a function of the amount of absorbed ionizing particles is a frequency of the corresponding acquisition signal.

4. The device according to claim 3, wherein the relative parameter is a ratio of frequencies of two signals obtained from the first and second acquisition signals.

5. The device according to claim 1, wherein the first acquiring circuit stage comprises an nMOS first ring oscillator and the second acquiring circuit stage comprises a pMOS second ring oscillator.

6. The device according to claim 5, wherein the 1st- or 2nd-degree polynomial relationship is given by the formula: $A*(N0-Nr)+B*(N0-Nr)^2$, where A and B are coefficients and where only one of A and B is possibly zero.

7. The device according to claim 1, wherein the first acquiring circuit stage comprises a pMOS first ring oscillator and the second acquiring circuit stage comprises an nMOS second ring oscillator.

8. The device according to claim 7, wherein the 1st- or 2nd-degree polynomial relationship is given by the formula: $A*(Nr-N0)+B*(Nr-N0)^2$, where A and B are coefficients and where only one of A and B is possibly zero.

9. The device according to claim 4, wherein the measuring circuit comprises:
    a frequency-divider stage configured to receive the first acquisition signal and configured to deliver a third acquisition signal having a frequency that is equal to a frequency of the first acquisition signal divided by an integer value; and
    a state-machine circuit stage that is coupled to the frequency-divider stage and configured to receive the second and third acquisition signals, the state-machine circuit stage configured to generate the relative parameter as a function of a ratio between the frequencies of the second and third acquisition signals.

10. The device according to claim 1, wherein the acquiring circuit comprises low-threshold-voltage MOS transistors and the processing circuit comprises regular-threshold-voltage MOS transistors.

11. The device according to claim 1, produced in digital technology.

12. An electronic system, comprising a device according to claim 1.

13. An electronic apparatus, comprising an electronic system as claimed in claim 12.

14. The apparatus according to claim 13, being a satellite communication apparatus.

15. A method, comprising:
    generating a first acquisition signal having a variable characteristic that is function of an amount of ionizing particles absorbed by a circuit;
    generating a second acquisition signal having a variable characteristic that is an opposite function of the amount of ionizing particles absorbed by the circuit;
    generating, on the basis of the first and second acquisition signals, a relative parameter indicative of a relationship between said variable characteristics; and
    computing a total ionizing dose using a 1st- or 2nd-degree polynomial relationship in said relative parameter.

16. The method according to claim 15, wherein the 1st- or 2nd-degree polynomial relationship includes an initial parameter corresponding to an absence of absorbed ionizing particles.

17. The device according to claim 15, wherein the variable characteristic is a frequency of the corresponding acquisition signal.

18. The device according to claim 17, wherein the relative parameter is a ratio of frequencies of two signals obtained from the first and second acquisition signals.

19. The method according to claim 18, wherein generating comprises:
    frequency dividing the first acquisition signal and to generate a third acquisition signal having a frequency that is equal to a frequency of the first acquisition signal divided by an integer value; and
    generating the relative parameter as a function of a ratio between the frequencies of the second and third acquisition signals.

20. A device for measuring ionizing particles, comprising:
    an nMOS first ring oscillator configured to generate a first acquisition signal having a characteristic that is variable as a function of an amount of absorbed ionizing particles;

a pMOS second ring oscillator configured to generate a second acquisition signal having a characteristic that is variable as a function of an amount of absorbed ionizing particles;

a first circuit configured to generate, on the basis of the first and second acquisition signals, a relative parameter indicative of a relationship between said characteristics that are variable; and a second circuit configured to compute a total ionizing dose from the relative parameter.

21. The circuit of claim 20, wherein the second circuit computes the total ionizing dose using a 1st-degree polynomial relationship in said relative parameter.

22. The circuit of claim 20, wherein the second circuit computes the total ionizing dose using a 2nd-degree polynomial relationship in said relative parameter.

23. The circuit of claim 20 wherein the characteristic that is variable as a function of the amount of absorbed ionizing particles is a frequency of each of the first and second acquisition signals.

24. The circuit of claim 23, wherein the relative parameter is a ratio of frequencies of two signals obtained from the first and second acquisition signals.

25. The circuit of claim 20, wherein the first circuit comprises:

a frequency-divider configured to generate a third acquisition signal having a frequency that is equal to a frequency of the first acquisition signal divided by an integer value; and a state-machine circuit configured to generate the relative parameter as a function of a ratio between the frequencies of the second and third acquisition signals.

* * * * *